US009202670B2

(12) United States Patent
Janssen et al.

(10) Patent No.: US 9,202,670 B2
(45) Date of Patent: Dec. 1, 2015

(54) METHOD OF INVESTIGATING THE WAVEFRONT OF A CHARGED-PARTICLE BEAM

(71) Applicant: FEI Company, Hillsboro, OR (US)

(72) Inventors: Bart Jozef Janssen, Eindhoven (NL); Gijs van Duinen, Utrecht (NL); Uwe Luecken, Eindhoven (NL); Ross Savage, Eindhoven (NL); Stephanus H.L. van den Boom, Geldrop (NL); Ivan Lazic, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/574,179

(22) Filed: Dec. 17, 2014

(65) Prior Publication Data
US 2015/0170876 A1 Jun. 18, 2015

(30) Foreign Application Priority Data

Dec. 18, 2013 (EP) .................................... 13198059

(51) Int. Cl.
*G21K 5/04* (2006.01)
*H01J 37/28* (2006.01)
(Continued)

(52) U.S. Cl.
CPC ................. *H01J 37/28* (2013.01); *H01J 37/20* (2013.01); *H01J 37/244* (2013.01); *H01J 37/265* (2013.01); *H01J 37/295* (2013.01); *H01J 2237/12* (2013.01); *H01J 2237/14* (2013.01);
(Continued)

(58) Field of Classification Search
USPC .................. 250/396 R, 397, 492.1, 492.3
See application file for complete search history.

(56) References Cited

U.S. PATENT DOCUMENTS

2010/0038537 A1   2/2010  Benner
2010/0231895 A1*  9/2010  Mann .................... G01B 9/021
                                                              356/72

(Continued)

FOREIGN PATENT DOCUMENTS

EP    2299468    3/2011

OTHER PUBLICATIONS

Sato, Kazuhisa, et al. "Atomic structure imaging of L1o-type FEPd nanoparticles by spherical aberration corrected high-resolution transmission electron microscopy," Journal of Applied Physics, 2009, pp. 034308-1-034308-5, vol. 105.

(Continued)

*Primary Examiner* — Nicole Ippolito
(74) *Attorney, Agent, or Firm* — Scheinberg & Associates, PC; Michael O. Scheinberg (57) ABSTRACT

A method of investigating a wavefront of a charged-particle beam that is directed from a source through an illuminator so as to traverse a sample plane and land upon a detector, an output of the detector being used in combination with a mathematical reconstruction technique so as to calculate at least one of phase information and amplitude information for the wavefront at a pre-defined location along its path to the detector, in which method:
  Said beam is caused to traverse a particle-optical lens system disposed between said sample plane and said detector;
  At a selected location in the path from said source to said detector, a modulator is used to locally produce a given modulation of the wavefront;
  In a series of measurement sessions, different such modulations are employed, and the associated detector outputs are collectively used in said mathematical reconstruction.

19 Claims, 3 Drawing Sheets (51) Int. Cl.
  *H01J 37/26* (2006.01)
  *H01J 37/20* (2006.01)
  *H01J 37/244* (2006.01)
  *H01J 37/295* (2006.01)

(52) U.S. Cl.
  CPC .. *H01J2237/226* (2013.01); *H01J 2237/24507* (2013.01); *H01J 2237/2614* (2013.01); *H01J 2237/2802* (2013.01); *H01J 2237/2806* (2013.01)

(56) References Cited

U.S. PATENT DOCUMENTS

2011/0205492 A1* 8/2011 Rathjen ............... A61F 9/008 351/221
2012/0153144 A1* 6/2012 McMorran ................ 250/307

OTHER PUBLICATIONS

Ando, Toshiyuki, et al. "Development of real-time defocus-modulation-type active image processing (DMAIP) for spherical-aberration-free TEM observation," Ultramicroscopy, 1994, pp. 261-267, vol. 54.

Rodenburg, J.M., et al., "A phase retrieval algorithm for shifting illumination", Applied Physics Letters 85 (21) pp. 4795-4797.

Malac, Marek, et al., "Practical Hole-Free Phase Plate Imaging: Principles, Advantages & Pitfalls," Microscopy and Microanalysis, 2012, pp. 484-485, vol. 18, Supp. 2).

Unknown, http://en.wikipedia.org/wiki/Electron_microscope, last accessed Dec. 17, 2014.

Unknonw, http://en.wikipedia.org/wiki/Electron_optics, last accessed Dec. 17, 2014.

Unknown, http://en.wikipedia.org/wiki/Scanning_electron_microscope, last accessed Dec. 17, 2014.

Unknown, http://en.wikipedia.org/wiki/Transmission_electron_microscopy, last accessed Dec. 17, 2014.

Humphry, M.J., et al., "Ptychographic electron microscopy using high-angle dark-field scattering for sub-nanometre resolution imaging", Nature Communications, published online Mar. 6, 2012, pp. 1-7.

Nagayama, Kuniaki, et al., "Phase contrast electron microscopy: development of thin-film phase plates and biological applications", Philos Trans R Soc Lond B Biol Sci., 2008, published online Mar. 13, 2008, pp. 2153-2162.

* cited by examiner

METHOD OF INVESTIGATING THE WAVEFRONT OF A CHARGED-PARTICLE BEAM

The invention relates to a method of investigating a wavefront of a charged-particle beam that is directed from a source through an illuminator so as to traverse a sample plane and land upon a detector, an output of the detector being used in combination with a mathematical reconstruction technique so as to calculate at least one of phase information and amplitude information for the wavefront at a pre-defined location along its path to the detector.

The invention additionally relates to an apparatus for performing such a method.

The invention further relates to a charged-particle microscope in which such a method can be enacted and/or in which such an apparatus can be comprised.

As used throughout this text, the ensuing terms should be interpreted consistent with the following explanation:

The phrase "charged particle" encompasses an electron or ion (generally a positive ion, such as a Gallium ion or Helium ion, for example, although a negative ion is also possible; the ion in question may be a charged atom or molecule). The term may also refer to a proton, for example.

The term "wavefront" should be interpreted in terms of the wave-particle duality of (sub-atomic) charged particles. In the wave associated with such a particle when propagating through space, a wavefront is a locus (abstract surface) of points that demonstrate (approximately) the same phase. In general terms, such a wavefront can be modified when traversing a sample with which the associated particle demonstrates some form of physical interaction. As with any wave, the wave associated with a charged particle will have an amplitude and a phase at any given point along its path.

The term "illuminator" refers to a particle-optical column comprising one or more electrostatic and/or magnetic lenses that can be used to manipulate a "raw" charged-particle beam from a source (e.g. a Schottky source or ion gun), serving to provide it with a certain focus or deflection, for example, and/or to mitigate one or more aberrations therein.

The term "microscope" refers to an apparatus that is used to create a magnified image of an object, feature or component that is generally too small to be seen in satisfactory detail with the naked human eye. In a charged-particle microscope (CPM), an imaging beam of charged particles is directed onto a sample from an illuminator. In certain types of CPM, an imaging system (a different particle-optical column to the illuminator) is used to focus charged particles traversing a thin sample onto a detector. In addition to imaging, a CPM may also have other functionalities, such as performing spectroscopy, examining diffractograms, performing (localized) surface modification (e.g. milling, etching, deposition), etc.

In what follows, the invention may—by way of example—sometimes be set forth in the specific context of electron microscopy. However, such simplification is intended solely for clarity/illustrative purposes, and should not be interpreted as limiting.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. In a TEM, the electron beam used to irradiate a sample will generally be of significantly higher energy than in the case of a SEM (e.g. 300 keV vs. 10 keV), so as to allow its constituent electrons to penetrate the full depth of the sample; for related reasons, a sample investigated in a TEM will also generally need to be thinner than one investigated in a SEM. In traditional electron microscopes, the imaging beam is "on" for an extended period of time during a given imaging capture; however, electron microscopes are also available in which imaging occurs on the basis of a relatively short "flash" or "burst" of electrons, such an approach being of potential benefit when attempting to image moving samples or radiation-sensitive specimens, for example. More information on some of the topics elucidated here can, for example, be gleaned from the following Wikipedia links:

http://en.wikipedia.org/wiki/Electron_optics
http://en.wikipedia.org/wiki/Electron_microscope
http://en.wikipedia.org/wiki/Scanning_electron_microscope
http://en.wikipedia.org/wiki/Transmission_electron_microscopy A method as set forth in the opening paragraph above is, for example, elucidated in an article by M. J. Humphry et al. in Nature Communications, 3:730, DOI 10:1038/ncomms1733, Macmillan Publishers Limited, 2011 (see the following link):

http://www.nature.com/ncomms/journal/v3/n3/pdf/ncomms1733.pdf

This article discusses so-called "electron ptychography", and its application to conduct a form of "lens-less microscopy" in a SEM. The approach disclosed in the article can be regarded as a modification of related techniques from the field of X-ray imaging, where lens-less techniques are attractive because of the difficulty in producing satisfactory X-ray optical systems. In the article, an illuminator produces a convergent electron beam that is focused onto and through a sample (in a sample plane) so as to impinge upon a CCD detector. The convergent electron beam is referred to as a "probe", and this probe is scanned across the sample in a series of measurement sessions. In each such session, an associated diffraction pattern is recorded by the CCD, and these various patterns are used as input to an iterative mathematical inverse problem solving technique in an attempt to reconstruct the amplitude/phase of the electron-beam wavefront exiting the sample (somewhat analogous to a deconvolution technique). This, in turn, provides information on the structure of the employed sample. For more information on this approach, see, for example, the article by J. M. Rodenburg and H. M. L. Faulkner in Appl. Phys. Lett. 85, pp. 4795-4798 (2004).

It is an object of the invention to provide an alternative to the prior-art technique set forth above. In particular, it is an object of the invention that said alternative should comprise aspects that are more flexible/versatile than corresponding aspects in the prior-art approach.

These and other objects are achieved in a method as set forth in the opening paragraph above, which method is characterized in that:

Said beam is caused to traverse a particle-optical lens system (LS) disposed between said sample plane and said detector;

At a selected location in the path from said source to said detector, a modulator is used to locally produce a given modulation of the wavefront;

In a series of measurement sessions, different such modulations are employed, and the associated detector outputs are collectively used in said mathematical reconstruction.

The phrase "lens system" (LS) as here employed should be broadly interpreted as referring to a particle-optical column comprising one or more electrostatic and/or magnetic lenses that can be used to form an image of an object located at an input side of the LS. The skilled artisan will understand that:

The LS may have sub-components with various functionalities. For example, it may comprise (inter alia) a series arrangement of an objective lens and a projection lens (either or both of which may be compound, i.e. multi-component).

The LS may be capable of forming an image at one or more internal/intermediate planes within the LS. For example, a parallel beam entering the LS (far-field mode) can be brought by an objective lens in the LS to a focus in a focal plane (the so-called "back focal plane" of the objective lens) located prior to a projection lens within the LS.

Similarly, the sample plane referred to above can be imaged by a first portion of the LS (e.g. an objective lens) onto an associated image plane. A second portion of the LS (e.g. a projection lens) can project this image plane onto an exit plane, where the above-mentioned detector can (for example) be placed.

If desired, an adjuster lens (which may be compound) can be used to adjust the position of the above-mentioned exit plane. For example, if multiple detectors are used, then (some of) these can be located in different planes, and the adjuster lens can be used to project/shift said exit plane onto selected ones of said different planes.

Use of the term "lens" does not limit the LS to comprise only purely refractive components: it may, in principle, also comprise components with a non-refractive functionality.

In forming an image of an object, (a portion of) the LS will typically introduce a magnification M>1, though this does not necessarily have to be the case. Imperfections in the LS will generally introduce aberrations into an otherwise perfectly uniform charged-particle beam that enters it; however, a typical LS may contain special lens elements (such as quadrupole, sextupole and/or octupole elements) whose function is to (attempt to) mitigate (some) such aberrations.

The following remarks are presented in order to facilitate a better understanding and appreciation of the invention:

(i) The invention is essentially counter-intuitive, in that it deliberately introduces a lens system (LS) into a type of technique that was originally of merit in that it was "lens-less".

(ii) The introduction of the LS in this manner could be regarded as undesirable, because the inevitable aberrations introduced by such a lens system may be seen as complicating the mathematical procedure required to perform wavefront reconstruction.

(iii) However, introduction of such an LS creates the concept of a spatially separated object space (in which the sample plane is located) and an associated image space. Creation of an image space in this manner provides greater flexibility, as will be set forth below.

(iv) The use of the LS allows one to leave the illumination condition of the sample plane unaltered between measurement sessions, and to instead employ other means (such as an adjustable masking plate or phase modulator) to effect a localized manipulation of the wavefront between measurement sessions. The ability to leave the illumination condition constant (which is the opposite to what is done in the above-mentioned prior-art article) creates an advantageous situation whereby there is no change in effective (mathematical) work function between measurement sessions.

(v) In a particular embodiment, the means referred to in point (iv) can be located in said image space of the LS. This can be advantageous in that, if the LS produces a magnification M>1, then localized manipulation as referred to in point (iv) can be performed in said image space with M times greater spatial resolution/accuracy than corresponding manipulation at the object side of the LS.

(vi) The inventive set-up allows two different types of wavefront investigation to be performed, as follows:

(a) The sample plane is left empty. In this case, the wavefront exiting the illuminator can be investigated, thus giving information on aberrations present in the wavefront before it reaches the sample plane.

(b) The sample plane is occupied by a sample. In this case, the wavefront exiting the sample can be investigated, thus giving information on the (internal) structure of the sample.

Information from an investigation of type (a) can (inter alia) be used to improve results from an investigation of type (b): by comparing the wavefront entering and leaving a sample, one can more accurately derive what the sample is doing to the wavefront during its passage through the sample.

(vii) The fear that aberrations introduced by the LS would complicate the mathematics of wavefront reconstruction was abated by the inventors, who showed that the effect of such aberrations could be dealt with mathematically without inordinate burden.

(viii) One way to implement the current invention is in a TEM, whereby the TEM's imaging system (see above) fulfils the role of the stipulated lens system LS of the present invention, and the TEM's sample holder occupies the abovementioned sample plane. Use of a TEM in this manner represents an innovative supplement to conventional ways of using a TEM (e.g. to perform standard (phase-contrast) imaging). The current invention allows a TEM to be used to analyze a full (complex) exit wavefront in a relatively straightforward manner unlike more tedious conventional exit wave analysis techniques, such as focal series reconstruction or holography, for example.

These various points will be elucidated in more detail hereunder.

In a particular embodiment of the method according to the current invention, the employed modulation is selected from the group comprising amplitude modulation, phase modulation, and combinations hereof. To start off with, the reason for performing wavefront modulation in the first place can be better understood by making the following analogy: by locally modulating/altering the wavefront and gathering detector data as a function thereof, one is effectively increasing the number of floating parameters that can be used to solve the mathematical inverse problem that serves as the basis of the desired wavefront reconstruction. One may liken this, to some extent, to a problem in which several simultaneous equations need to be solved, but the number of variables exceeds the available number of equations; increasing the number of equations will serve to reduce the size of the corresponding solution space, and, accordingly, simplify the problem to be solved. Secondly, since a wavefront contains amplitude and phase information, it can, generally speaking, be appropriately modulated in the context of the current invention by locally changing its amplitude and/or phase in a controlled manner. For example:

One can employ an adjustable (movable/exchangeable) masking plate (spatial modulator) that blocks a selectable first portion of a wavefront traversing it and admits a selectable second portion of the wavefront.

In an alternative or supplementary approach, one can employ a phase modulator (e.g. a so-called "phase plate") to alter the phase of a wavefront traversing it by a pre-selected amount, e.g. $\pi/2$ or $\pi$.

These aspects will be elucidated in more detail below.

In a particular embodiment of the invention as set forth in the previous paragraph, the modulator comprises:

At least one masking plate. Such a masking plate may, for example, comprise a substantially opaque plate containing one or more apertures therein (thus forming a so-called "aperture plate"). Such a plate may, for instance, be made of Al-coated Si and the/each aperture therein may have a width of the order of about 10 μm, for example. An alternative type of masking plate may take the form of an occulting disk, for example (which may be conceptually regarded as being a "photographic negative" of an aperture plate).

An actuator system that can be used to adjust a parameter selected from the group comprising:

A position of said masking plate relative to an optical axis of the LS;

A rotational stance of said masking plate relative to said optical axis;

A shape of said masking plate (e.g. vis-à-vis an aperture therein);

A size of said masking plate (e.g. vis-à-vis an aperture therein), and combinations hereof.

The masking plate may, for example, be oriented so that its plane is substantially perpendicular to the optical axis of the LS (though this is not strictly necessary). In a set-up such as this, the size, shape and position/rotational stance of the (aperture(s) in the) masking plate determine the properties of the portion of wavefront that is allowed to proceed further toward the detector. In order to render such properties adjustable, one can use one or more of the following mechanisms:

(I) The transverse position of the masking plate relative to said optical axis can be adjusted. In so doing, (an aperture in) the masking plate is moved to a pre-selected region of the wavefront. Alternatively and/or supplementally, a rotational stance of (an aperture in) the masking plate can be adjusted by rotating/partially orbiting the masking plate about said optical axis. For a non-circular (aperture in a) masking plate, such angular alteration will (in general) lead to wavefront alteration.

(II) The shape of the masking plate can be adjusted. One way to achieve this is to have a "library" of different masking plates (e.g. with apertures of different shapes) and an exchanger mechanism that can move a chosen masking plate into position in the beam path. If desired, such an exchanger mechanism can pass the chosen masking plate to a transverse/angular adjustment mechanism as referred to in (I).

(III) The size of (an aperture in the) masking plate can be varied. One way to do this is to use a masking plate comprising an adjustable iris diaphragm, for example; if desired, such a masking plate could then be used in conjunction with a transverse/angular adjustment mechanism as referred to in (I), for instance. Alternatively, one could use a mechanism as set forth in (II) above, in which the library (also) contains masking plates having (apertures of) different sizes.

In cases (I)-(III), the adjustment concerned can be effected with the aid of suitable actuators, e.g. selected from the group comprising stepper motors, voice coil motors, pneumatic actuators, hydraulic actuators, etc. The skilled artisan will be well able to choose an actuation mechanism to suit the needs of a given situation.

In an alternative (and/or supplemental) approach to that set forth in the previous paragraph, the modulator comprises a phase modulator. Phase modulators for use in charged-particle optics come in different varieties. For example:

(A) A so-called Zernike phase plate comprises a thin film (with a typical thickness in the range 10-40 nm, and comprising amorphous C, Au or Ge, for example) in which a tiny hole is drilled. The plate is oriented perpendicular to the optical axis of the LS, which axis passes through said hole. The film produces a phase retardation of $\pi/2$, with zero retardation in the hole.

(B) A so-called Hilbert phase plate also comprises a thin film, but this is twice as thick as in a Zernike plate. Moreover, the film only spans half the field of view along said optical axis, and contains no central hole. The phase retardation produced by the Hilbert plate is $\pi$.

(C) As a generalization of the principles/mechanisms employed in the Zernike and Hilbert plates, one can conceive a phase plate that employs a thin film of varying thickness. The phase shift experienced by a particle-optical beam traversing such a plate will depend on the local thickness of said film at the location where the beam impinges upon it.

(D) A so-called Boersch phase modulator is basically a relatively small ring-shaped device having a sandwiched/stacked structure of conducting/insulating layers. When a given electrostatic potential is applied to such a device, a charged-particle beam passing through its open central region can be made to undergo a phase shift. See, for example, U.S. Pat. No. 5,814,815 for more information on such an arrangement.

(E) One can use a hybrid phase plate, comprising a Boersch phase modulator in which a Zernike phase plate is mounted. See, for example, U.S. Pat. No. 8,071,954 for more information on such an arrangement.

(F) In principle, one could also use a phase modulator in the form of a so-called "particle-optical prism", such as used in particle-optical holography, for example.

Analogous to the situation set forth in the previous paragraph, one may (if desired) employ an actuator system to perform functions such as:

Adjusting a position of a given phase modulating element (e.g. phase plate or prism) relative to an optical axis of the LS.

Adjusting a rotational stance of such an element relative to (about) said optical axis.

Switching different types of phase modulating element into the path of the charged-particle beam, using an exchanger mechanism in combination with a "library" of such elements.

Alternatively and/or supplementally, one could adjust an electrical potential/current supplied to an "active-type" (i.e. electrically adjustable) phase modulator, such as types (D)-(F) referred to above.

Using techniques such as these, one can allow the magnitude of the effected phase change to be altered at will.

For some general information on phase plates, reference is made to the following journal publications:

Kuniaki Nagayama and Radostin Danev, *Phase contrast electron microscopy: development of thin-film phase plates and biological applications*, Phil. Trans. R. Soc. B, 363, pp. 2153-2162 (2008).

Marek Malac, Michael Bergen, Masahiro Kawasaki, Marco Beleggia, Ray Egerton, M. Shimizu, H. Furukawa, *Practical Hole-Free Phase Plate Imaging: Principles, Advantages and Pitfalls*, Microscopy and Microanalysis 18 (Suppl. 2), pp. 484-485 (2012).

With reference to the three previous paragraphs, it is also possible to conceive a modulator that comprises a series arrangement of an amplitude modulator and a phase modulator, which can be used independently of one another and/or in unison. Such an arrangement admits great flexibility/diversity as regards the wavefront manipulation employed in the current invention.

In a particular embodiment of the current invention, the aforementioned "selected location"—where localized wavefront modulation is performed is disposed in an image space of said lens system LS; for example, if the LS comprises an objective lens followed by a projection lens, then said selected location may be disposed in the image space of said objective lens. In principle, the selected location can be chosen as desired, and wavefront modulation can be performed in any of a variety of positions, e.g. between the source/illuminator and sample plane, and more specifically at the sample plane itself. However, the inventors have found it advantageous to perform such modulation in an image space of the employed LS (as opposed to a location at its object side). One reason for this is that, as referred to above, if the LS produces a magnification M>1 between an object space and an associated image space, then an object-space transverse displacement (perpendicular to a particle-optical axis of the LS) of magnitude $\Delta$ can correspond to an image-space transverse displacement of magnitude $M\Delta$, i.e. M times larger. This effectively allows the localized wavefront modulation stipulated above to be performed with M times greater resolution/positioning accuracy in said image space of the LS than in said object space. If, for example, a movable masking plate or phase modulator is used to effect the desired wavefront modulation (as alluded to in the previous paragraph), then the effect described here means that, if such a plate is located in said image space of the LS, an actuator used to perform adjustment of the transverse position of the plate can afford to be M times less precise—or, alternatively, will produce M times finer adjustments—than one located in said object space of the LS.

In a further embodiment of the scenario set forth in the previous paragraph, said "selected location" is disposed at or proximal an image plane of the LS. Of the various possible locations in the abovementioned image space of the LS, an image plane represents the axial position (along the particle-optical axis of the LS) at which defocus is minimal. Accordingly, information in a charged-particle beam traversing said image space will be at its most spatially resolved/sharpest (in a direction transverse to the optical axis of the LS) at said image plane. Consequently, a masking plate or phase modulator as referred to above will achieve maximal spatial selectivity when used in said image plane. Further advantages of locating the employed modulator in said image plane relate to calibration considerations. For example, if the current invention is performed in a TEM (using the imaging system of the TEM to serve as the LS of the present invention), then such a TEM can be made to operate in a "normal imaging" mode. In that case, if an amplitude modulator is located in said image plane, it will cast a sharp image on the employed detector. This allows for easy calibration of relative shifts and/or rotations between different modulator states. Moreover, it allows a good initial value to be chosen for the aperture function A referred to in Embodiment 2 below (see Eq. (1) hereunder). Furthermore, if a known calibration sample—which shows pronounced, known diffraction peaks or rings—is used in combination with the amplitude modulator, the modulator's effective geometry with respect to the sample can be efficiently calibrated (in a well-calibrated system, measured diffraction peaks/rings should coincide with the power spectrum of the obtained image in "normal imaging" mode). This having been said, it is worth noting that, from a purely mathematical perspective (vis-à-vis the employed computational reconstruction scheme) there is no stringent restriction on the exact "selected location" that is chosen for placement of the modulator: computationally, one can get it back into focus if need be (just as other aberrations of the (objective lens in the) LS can be mathematically compensated for).

The skilled artisan will understand the term "proximal" as used in this document, and be able to give it appropriate meaning. Nevertheless, for the avoidance of doubt, the term may be given a specifically delimited definition. For example, an item can be regarded as "proximal" a plane if the distance between the item and the plane (along the particle-optical axis) is less than 20% of a focal length of a lens with which the plane is associated. So, for example, in the previous paragraph, an item is "proximal" the image plane if its separation from the image plane (along the particle-optical axis) is at most 20% of the focal length of the objective lens. Needless to say, the smaller this separation, the smaller will be the degree of defocus experienced; however, sometimes, a deliberate amount of defocus can be desirable.

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols. It should be noted that, in general, the Figures are not to scale.

DETAILED DESCRIPTION OF SEVERAL EMBODIMENTS

Embodiment 1

Figure 1:
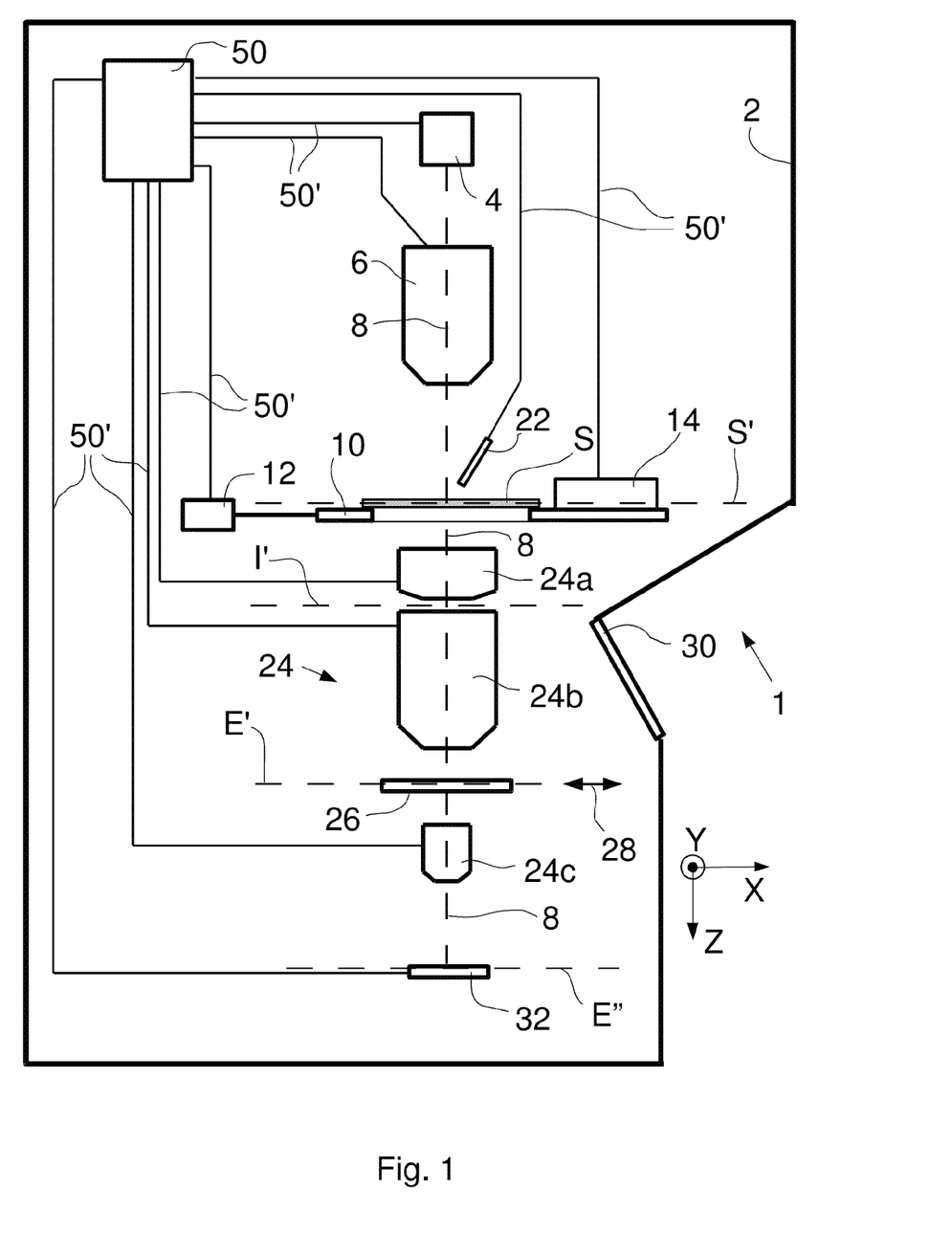
FIG. 1 renders a longitudinal cross-sectional view of a CPM in which an embodiment of the current invention can be carried out.

FIG. 1 is a highly schematic depiction of an embodiment of a charged-particle microscope 1 that lends itself to use in conjunction with the current invention. In the Figure, a vacuum enclosure 2 encapsulates a CPM, which in this case is a TEM. In the depicted TEM, an electron source 4 (such as a Schottky gun, for example) produces a beam of electrons that traverse an electron-optical illuminator 6, serving to direct/focus them onto a chosen region of a (substantially planar) sample S that is located in a sample plane S'. This illuminator 6 has an electron-optical axis 8, and will generally comprise a variety of electrostatic/magnetic lenses, deflectors, correctors (such as stigmators), etc.; typically, it can also comprise a condenser system.

The sample S is held on a supporting device 10 than can be positioned in multiple degrees of freedom by a positioning device (stage) 12; for example, the supporting device 10 may comprise a finger that can be moved (inter alia) in the XY plane (see the depicted Cartesian coordinate system). Such movement allows different regions of the sample S to be irradiated/imaged/inspected by the electron beam traveling along axis 8, and also allows scanning motion to be performed in STEM mode. An optional cooling device 14 is in intimate thermal contact with the supporting device 10, and is capable of maintaining the latter at cryogenic temperatures, e.g. using a circulating cryogenic coolant to achieve and maintain a desired low temperature.

The focused electron beam traveling along axis 8 will interact with the sample S in such a manner as to cause various types of "stimulated" radiation to be emitted from the sample S, including (for example) secondary electrons, backscattered electrons, X-rays and optical radiation (cathodoluminescence); if desired, one or more of these radiation types can be detected with the aid of detector 22, which might be a combined scintillator/photomultiplier or EDX (Energy-Dispersive X-Ray Spectroscopy) detector, for instance. However, of predominant interest in a TEM are electrons that pass through the sample, emerge from it and continue to propagate along axis 8. Such transmitted electrons enter an imaging system 24, which will generally comprise a variety of electrostatic/magnetic lenses, deflectors, correctors (such as stigmators), etc. This imaging system 24 can focus the transmitted electrons onto a fluorescent screen 26, which, if desired, can be retracted/withdrawn (as schematically indicated by arrows 28) so as to get it out of the way of axis 8. An image of (part of) the sample S will be formed by imaging system 24 on screen 26, and this may be viewed through viewing port 30 located in a suitable portion of the wall 2. The retraction mechanism for screen 26 may, for example, be mechanical and/or electrical in nature, and is not depicted here.

As here illustrated, imaging system 24 comprises a series arrangement of a first portion 24a, a second portion 24b and a third portion 24c, which respectively play the role of objective lens 24a, projection lens 24b and adjuster lens 24c (see above). The objective lens 24a is capable of imaging the sample plane S' onto an (intermediate) image plane I', with a magnification M>1, e.g. M=50. The projection lens 24b can then project the image plane I' onto a first exit plane E', at/proximal which said screen 26 is located. As an alternative to viewing an image on screen 26, one can instead make use of (pixelated) electron detector 32, such as a CMOS or CCD detector, for example. To this end, adjuster lens 24c can be enacted so as to shift the focus of the electrons emerging from projection lens 24b and re-direct/focus them onto a second exit plane E" (at/proximal which detector 32 is located) rather than first exit plane E' (from which screen 26 has now been retracted (see above)). At detector 32, the electrons can form an image that can be processed by controller 50 and displayed on a display device (not depicted), such as a flat panel display, for example. The skilled artisan will be very familiar with these various possibilities, which require no further elucidation here.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). The skilled artisan will understand that the interior of the enclosure 2 does not have to be kept at a strict vacuum; for example, in a so-called "Environmental TEM", a background atmosphere of a given gas is deliberately introduced/maintained within the enclosure 2.

In the context of a particular embodiment of the current invention, the imaging system 24 of the illustrated TEM 1 can be used to play the role of the lens system LS elucidated above. To this end, the imaging system 24 of the TEM 1 is modified so as to make the image plane I' (more) accessible from outside the imaging system 24; this (for example) allows a modulator (not depicted; see FIG. 2) to be inserted into and moved/adjusted within the image plane I'. The TEM 1 can then be used as follows:

For a given setting/position of said modulator, the detector 32 can be used to record a diffractogram produced when an electron wavefront is caused to traverse the sample plane S', (modulated) image plane I' and LS 24, and impinge upon exit plane E". In this way, one performs a "measurement session" $m_n$.

By altering the setting/position of said modulator, and recording the associated (altered) diffractogram then produced at detector 32, one performs a different measurement session $m_{n+1}$.

Repeating this procedure results in a series $\{m_n\}$ of measurement sessions. The data acquired during this series $\{m_n\}$ can be processed by controller 50 (for example) to perform mathematical wavefront reconstruction according to the current invention.

The cardinality C of the set $\{m_n\}$ (i.e. the number of different measurement sessions used to acquire data) is a matter of choice, and will typically be influenced by a number of factors, such as the geometry of the employed modulator, the size of the sample (object) to be imaged, and the resolution with which the exit wave is to be imaged at the sample plane, for example. By way of non-limiting example, one could, for instance, use a value C in the range 25-250.

This process will be set forth in more detail in the next embodiment.

Embodiment 2

Figure 2A:
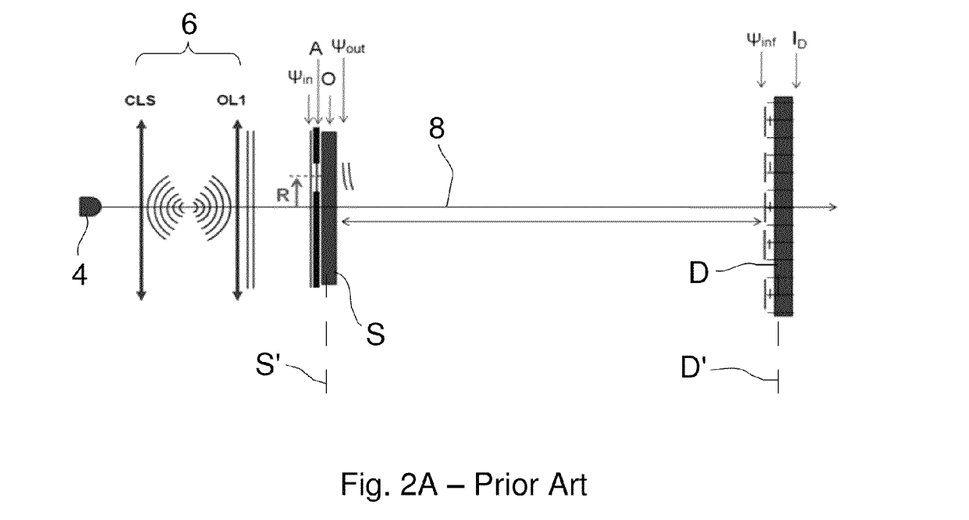
FIGS. 2A to 2D show various aspects underlying the current invention, in the context of explaining the physical and mathematical processes involved in a charged-particle wavefront reconstruction technique.
Figure 2B:
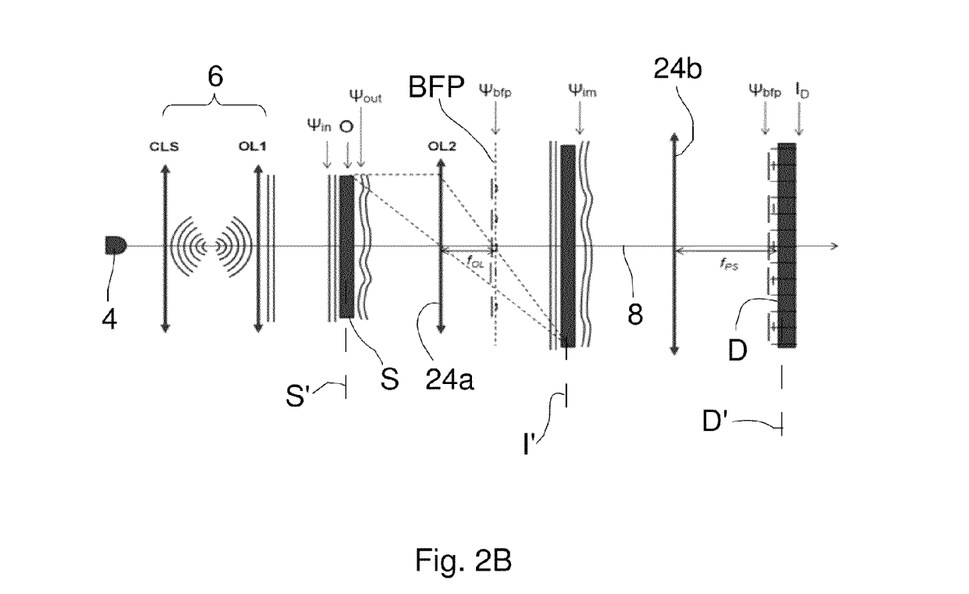
Figure 2C:
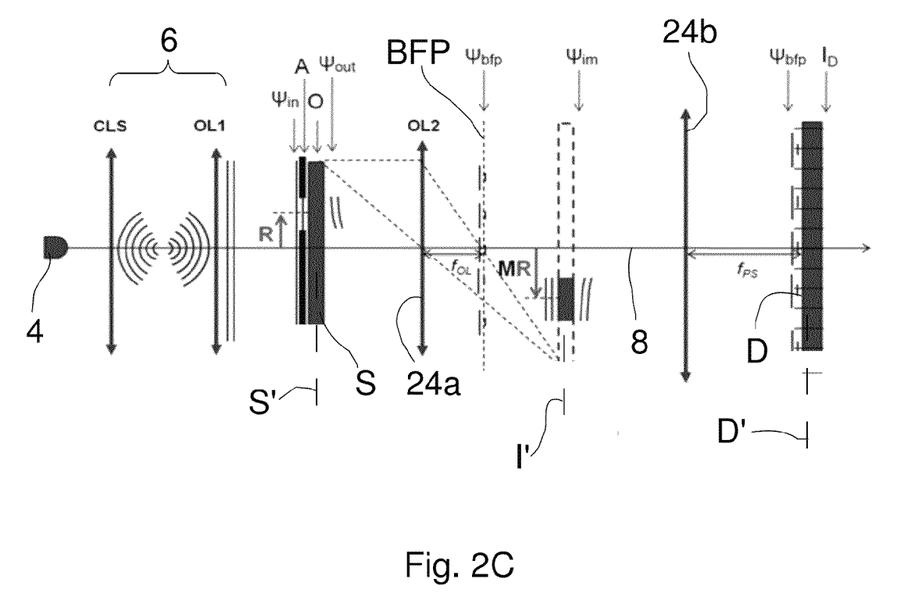
Figure 2D:
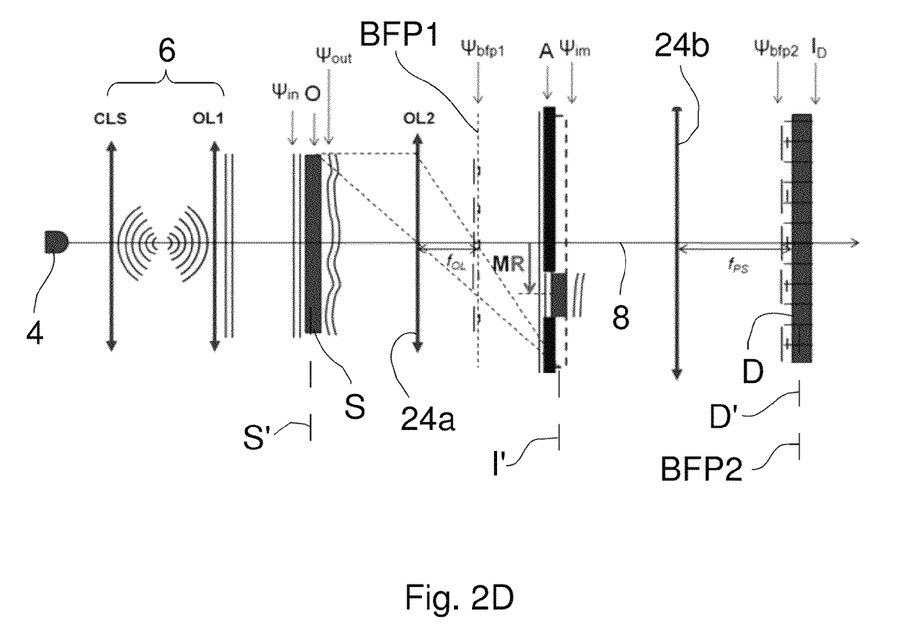

FIGS. 2A to 2D show various aspects underlying the current invention, in the context of explaining the physical and mathematical processes involved in a charged-particle wavefront reconstruction technique. In these Figures:

FIG. 2A illustrates a prior-art situation;

FIG. 2D represents an embodiment of the current invention similar/analogous to that set forth above in Embodiment 1;

FIGS. 2B and 2C represent intermediate scenarios used to develop the mathematical discussion of FIG. 2D.

To facilitate comparison between FIGS. 2A-2D and FIG. 1, certain (approximately) corresponding features between the Figures have been given the same reference symbols. Furthermore, it should be noted that, whereas FIG. 1 depicts its particle-optical axis as progressing from top to bottom, FIGS. 2A-2D depict their particle-optical axes as progressing from left to right. Although the configurations shown in FIGS. 2B-2D may be comprised in a CPM (such as the TEM of FIG. 1), they do not necessarily have to be, i.e. it is also possible to construct a dedicated apparatus to perform wavefront reconstruction as provided by the current invention.

Example 1

Prior Art

FIG. 2A shows a prior-art electron-beam ptychography setup such as that used in the above-referenced article by M. J. Humphry et al. In the Figure, an electron beam propagates along an optical axis 8 from a source 4 through an illuminator 6 and a sample plane S' and impinges upon a detector plane D'. The illuminator 6 comprises (at least) a condenser lens CLS and an objective lens OL1, arranged in series. The sample plane S' is occupied by a sample S (i.e. object O), and the detector plane D' is occupied by a detector D. A modulator A—which, in this case, is an aperture plate—is located just prior to the sample plane S'. The illuminator 6 illuminates this modulator A with a planar wave. The detector plane D' functionally corresponds to the exit plane E' of FIG. 1. Note the absence of a lens system between the sample plane S' and the detector plane D'. As such, the set-up in FIG. 2A essentially corresponds to a special implementation of a SEM.

A mathematical description will now be given of the formation of an image on the detector D. Referring to FIG. 2A, the exit wave in the sample plane (object plane) S' is given by:

$$\Psi_{out}(\vec{r}) = \Psi_{in}(\vec{r}) O(\vec{r}) A_{\vec{R}}(\vec{r}) (= \Psi_{in} OA) \quad (1)$$

where:

$\Psi_{in}$ is an input electron wave, with $\Psi_{in}=1$ for a plane wave.

$\vec{r}$ indicates position within a plane perpendicular to the optical axis 8 (with origin at the optical axis 8).

$O(\vec{r})$ is a so-called Object Function, an exponential function that (according to CTF (Contrast Transfer Function) theory) renders the projected potential of an object along the electron wave propagation direction.

$A_{\vec{R}}(\vec{r})$ is a modulator function. In the current case, it is a blocking aperture function, with a value of one within an aperture centered on $\vec{R}$ and a value of zero everywhere else. The radius of said aperture is not labeled in FIG. 2A.

Using the Huygens principle, the final image at infinity is the Fourier Transform (FT) of the output wave:

$$\Psi_{inf} = FT\{\Psi_{out}\} = FT\{\Psi_{in} OA\} \quad (2)$$

Therefore the image recorded by detector D is given by:

$$I_D = |\Psi_{inf}|^2 \quad (3)$$

One can now perform a series of measurement sessions $\{m_n\}$, $n=\{1, \ldots, N\}$. Within each of these measurement sessions, the state of the modulator $A^n = A_{\vec{R}_n}(\vec{r})$ (which, in the current case, is given only by the aperture position $\vec{R} = \vec{R}_n$) is defined, and an image $I_D = I_D^n$ is acquired. An iterative scheme such as that set forth in Embodiment 3 below can then be applied. Such a scheme uses Eq. (2) to mathematically propagate the estimated electron wave back and forth between the sample plane S' and detector plane D' (applying only the FT and inverse FT) for each measurement session $m_r$. In the reconstruction scheme, Eq. (3) is used to correct the amplitude of $\Psi_{inf}$ in each iteration (or, explicitly, $|\Psi_{inf}| = \sqrt{I_D}$). This approach yields the reconstructed illumination $\Psi_{in}(\vec{r})$ and the object function $O(\vec{r})$. In other words, one can produce the full output electron wave $\omega_{out}^{ob}(\vec{r}) = \Psi_{in}(\vec{r}) O(\vec{r})$.

Example 2

Modified Prior Art

Relative to the situation depicted in FIG. 2A, additional items are illustrated in FIG. 2B. In particular, FIG. 2B comprises a series arrangement of an objective lens 24a (OL2) and a projection lens 24b, which together form a lens system LS as alluded to above. The objective lens 24a has a Back Focal Plane BFP; moreover, it images the sample plane S' onto an (intermediate) image plane I'. The projection lens 24b has a focal length $f_{PS}$. Note that there is no modulator A (compare with FIG. 2A); as a result of this, the image at image plane I' is a "full image" of the sample S.

The situation in FIG. 2C is identical to that shown in FIG. 2B, except in that a modulator A has now been introduced, in the same location as shown in FIG. 2A. As a result of the presence of this modulator A, the image at image plane I' will now only be a "partial image" of the sample S (due to the curtailed illumination of sample S caused by modulator A).

In both FIGS. 2B and 2C, objective lens 24a produces a magnification M; hence, vector $\vec{R}$ at the object side of objective lens 24a becomes vector $M\vec{R}$ at its image side. The image plane I' will be aberrated if objective lens 24a is not perfect. On the other hand, projection lens 24b is considered to be practically perfect, i.e. to have negligible effect as regards introducing aberrations. If both the objective lens 24a and the projection lens 24b are perfect and in focus, then the situations illustrated in FIGS. 2A and 2C will effectively be identical ($\Psi_{inf} = \Psi_{bfp}$: see below). If there is no modulator A present, then the situation in FIG. 2B will further effectively be identical to that in FIGS. 2A and 2C.

The mathematical reconstruction scheme set forth in Example 1 above (in conjunction with Embodiment 3 below) can be applied directly to the situation shown in FIG. 2C. First, one finds the final electron wave and the intensity recorded by the detector D (analogous to Eq. (2) and Eq. (3) above). The electron wave at BFP is:

$$\psi_{bfp} = FT\{\psi_{out}\} K_{cs}(\vec{q}) e^{-i\chi(\vec{q})} e^{-i\pi\lambda\Delta f q^2}$$
$$= FT\{\psi_{in} OA\} K_{cs}(\vec{q}) e^{-i\chi(\vec{q})} e^{-i\pi\lambda\Delta f q^2} \quad (4)$$

where $\vec{q} = (q_x, q_y)$ are the coordinates in reciprocal space. Eq. (4) can also be re-written as:

$$\Psi_{bfp} = FT\{(\Psi_{in} OA) \otimes IFT\{K_{cs}(\vec{q}) e^{-i\chi(\vec{q})}\}\} e^{-i\pi\lambda\Delta f q^2} \quad (5)$$

where:

IFT indicates the Inverse Fourier Transform.

Operator $\otimes$ is a convolution operator.

$K_{cs}(\vec{q})$ is an incoherence function of the source 4.

$e^{-i\chi(\vec{q})}$ is an aberration function excluding defocus, for objective lens 24a.

$e^{-i\pi\lambda\Delta f q^2}$ is an aberration function due to pure defocus $\Delta f$, for objective lens 24a.

$\lambda$ is the wavelength of the electron wave.

Neglecting aberrations in the projection lens 24b, the final electron wave in front of the detector D is equivalent to that at BFP (from BFP to I', the electron wave is obtained by IFT; to get to the detector D, another FT is applied). Possible magnification of projection lens 24b is of no interest or influence here, and is thus set to a value of 1. In this example, the illumination wave function $\Psi_{in}$ is considered to be a plane wave (and thus constant, $\Psi_{in}=1$). Associated with the modulator is a blocking aperture function A that is part-by-part constant. Considering this, $\Psi_{in}$ and the aperture function A can be placed outside of the convolution operator $\otimes$, and Eq. (5) can be rearranged as:

$$\Psi_{bfp} = FT\{\Psi_{in}(O \otimes IFT\{K_{cs}(\vec{q}) e^{-i\chi(\vec{q})}\}) A\} e^{-i\pi\lambda\Delta f q^2} \quad (6)$$

The image produced by the detector D now simply becomes:

$$I_D = |\Psi_{bfp}|^2 \tag{7}$$

Equations (6) and (7) can now be used in the same way as equations (2) and (3). One can again perform a series of measurement sessions $\{m_n\}$, $n=\{1, \ldots, N\}$ analogous to those performed in Example 1. Within each of these measurement sessions, the aperture position $\vec{R}=\vec{R}_n$ is set, thus defining the aperture function $A^n = A_{\vec{R}_n}(\vec{r})$, and the associated image $I_D = I_D{}^n$ is acquired. A mathematical reconstruction scheme such as that set forth in the Embodiment 3 below can then be applied. Such a scheme uses Eq. (6) to mathematically propagate the estimated electron wave back and forth between the sample plane S' and detector plane D' (applying only the FT and inverse FT) for each measurement session $m_n$. By correcting the amplitude of $\Psi_{bfp}$ in each iteration using Eq. (7) (or, explicitly, $|\Psi_{bfp}|=\sqrt{I_D}$), the scheme yields the reconstructed illumination $\Psi_{in}(\vec{r})$ and the resulting aberrated object function $O_{res}(\vec{r})$, explicitly given by $O_{res}(\vec{r}) = O(\vec{r}) \otimes IFT\{K_{cs}e^{-i\chi(\vec{q})}\}$. Since the defocus factor in Eq. (6), $e^{-i\pi\lambda\Delta f q^2}$, is a Gaussian function, its FT and IFT are also Gaussians. Therefore, this factor will stay unchanged when transforming back and forth between the sample plane S' and detector plane D'. Further, since only the amplitude of $\Psi_{bfp}$ is corrected in each iteration according to $|\Psi_{bfp}|=\sqrt{I_D}$, defocus $e^{-i\pi\lambda\Delta f q^2}$ will again have no effect (since it is a pure phase contribution).

To summarize, in this modified example, the final reconstructed entities will be the illumination $\Psi_{in}(\vec{r})$ (in this case a fully-known, plane wave) and the aberrated object function $O_{res}(\vec{r}) = O(\vec{r}) \otimes IFT\{K_{cs}e^{-i\chi(\vec{q})}\}$. When aberrations are negligible in objective lens 24a ($\chi(\vec{q})=0$) and illumination is perfect (no incoherence, $K_{cs}(\vec{q})=1$), Eq. (6) becomes:

$$\Psi_{bfp} = FT\{\Psi_{in}OA\}e^{-\pi\lambda\Delta f q^2} \tag{8}$$

which is exactly the same as Eq. (2) when in focus ($\Delta f=0$). When not in focus, as just explained, the pure Gaussian factor $e^{-i\pi\lambda\Delta f q^2}$ will remain unchanged, and will not influence the reconstruction.

Example 3

Further Modification

FIG. 2D is similar to the situation illustrated in FIG. 2C, except that the modulator A has now been moved to a location at the image plane I'. As a result of this, it is now necessary to make a distinction between two Back Focal Planes—namely BFP1 of objective lens 24a (corresponding to BFP in FIGS. 2B and 2C) and BFP2 of projection lens 24b, which coincides with detector plane D'—because modulator A performs its function between them (see Eq. (11)).

In the setup shown in FIG. 2D, the mathematical reconstruction scheme set forth in Examples 1 and 2 above (in conjunction with Embodiment 3 below) can again be applied directly. First, one finds the final electron wave and the intensity recorded by detector D (analogous to Eq. (2) and Eq. (3)). The electron wave in BFP1 is:

$$\begin{aligned}\psi_{bfp1} &= FT\{\psi_{out}\}K_{cs}(\vec{q})e^{-i\chi(\vec{q})}e^{-i\pi\lambda\Delta f q^2} \\ &= FT\{\psi_{in}O\}K_{cs}(\vec{q})e^{-i\chi(\vec{q})}e^{-i\pi\lambda\Delta f q^2}\end{aligned} \tag{9}$$

where $\vec{q}=(q_x, q_y)$ are coordinates in the Fourier domain.

In the image plane I', the electron wave (the image of the sample output wave) in the absence of an aperture is:

$$\Psi_{im} = IFT\{\Psi_{bfp1}\} = (\Psi_{in}O) \otimes IFT\{K_{cs}(\vec{q})e^{-i\chi(\vec{q})}e^{-i\pi\lambda\Delta f q^2}\} \tag{10}$$

When an aperture A is present in the image plane I', then Eq. (10) becomes:

$$\Psi_{im} = ((\Psi_{in}O) \otimes IFT\{K_{cs}(\vec{q})e^{-i\chi(\vec{q})}e^{-i\pi\lambda\Delta f q^2}\})A \tag{11}$$

Further, the image in BFP2 is:

$$\Psi_{bfp2} = FT\{\Psi_{im}\} = FT\{((\Psi_{in}O) \otimes IFT\{K_{cs}(\vec{q})e^{-i\chi(\vec{q})}e^{-i\pi\lambda\Delta f q^2}\})A\} \tag{12}$$

or, if one uses the fact that the illumination from illuminator 6 is a constant plane wave, the final result becomes:

$$\Psi_{bfp2} = FT\{\Psi_{in}(O \otimes IFT\{K_{cs}(\vec{q})e^{-i\chi(\vec{q})}e^{-i\pi\lambda\Delta f q^2}\})A\} \tag{13}$$

The image that the detector D produces is:

$$I_D = |\Psi_{bfp2}|^2 \tag{14}$$

Equations (13) and (14) are now used in the same way as equations (2) and (3). One can again perform a series of measurement sessions $\{m_n\}$, $n=\{1, \ldots, N\}$ analogous to those performed in the previous two examples. Within each of these measurement sessions, the aperture position $\vec{R}=\vec{R}_n$ is set, thus defining the aperture function $A^n = A_{\vec{R}_n}(r)$, and an image $I_D = I_D{}^n$ is acquired. The mathematical reconstruction scheme such as that set forth in Embodiment 3 below can then be applied. In this case, such a scheme uses Eq. (13) to mathematically propagate the estimated electron wave back and forth between the sample plane S' and detector plane D' (applying only the FT and inverse FT) for each measurement session $m_n$. By correcting the amplitude of $\Psi_{bfp2}$ in each iteration using Eq. (14) (or, explicity, $|\Psi_{bfp2}|=\sqrt{I_D}$), the scheme yields the reconstructed illumination $\Psi_{in}(\vec{r})$ (in this case fully-known and constant) and the resulting aberrated and defocused object function $O_{res}(\vec{r}) = O(\vec{r}) \otimes IFT\{K_{cs}(\vec{q})e^{-i\chi(\vec{q})}e^{-i\pi\lambda\Delta f q^2}\}$, which is the object function at plane I'. It is stressed that the aberrated, in-focus exit wave at the sample plane S' can be obtained from the reconstructed electron wave at the image plane I' by back-propagation. If aberrations of the objective lens 24a are known, they can also be eliminated by deconvolution.

If aberrations are negligible or not present ($\chi(\vec{q})=0$) and illumination is perfect (no incoherence, $K_{cs}(\vec{q})=1$), Eq. (13) becomes:

$$\Psi_{bfp2} = FT\{\Psi_{in}(O \otimes IFT\{e^{-i\pi\lambda\Delta f q^2}\})A\} \tag{15}$$

When defocus is zero ($\Delta f=0$), Eq. (15) becomes simply the same as Eq. (2):

$$\Psi_{bfp2} = FT\{\Psi_{in}(O \otimes IFT\{1\})A\} = FT\{\Psi_{in}(O \otimes \delta)A\} = FT\{\Psi_{in}OA\} \tag{16}$$

because, for any function $f(\vec{r})$, it holds that $f(\vec{r}) \otimes \delta(\vec{r}) = f(\vec{r})$.

Example 4

Situation with and without Sample

Comparing Eq. (2) and (16), it is seen that the prior-art approach in FIG. 2B/Example 1 and the approach according to the current invention yield identical results when objective lens 24a is perfect and in-focus, and when the sample S is illuminated by a plane wave from illuminator 6. An important distinguishing aspect of the current invention will now be elucidated, starting from Eq. (12).

Situation 4.1:
If sample plane S' is vacant (i.e. no sample is intercepted by the electron beam), then the object function becomes one (O=1) and Eq. (12) becomes:

$$\Psi_{bfp2}=FT\{\Psi_{im}\}=FT\{1\cdot(\Psi_{in}\otimes IFT\{K_{cs}(\vec{q})e^{-i\chi(\vec{q})}e^{-i\pi\lambda\Delta fq^2}\})\cdot A\} \quad (12a)$$

The reconstructed item in the mathematical reconstruction scheme is then:

$$\Psi_{in}\otimes IFT\{K_{cs}(\vec{q})e^{-i\chi(\vec{q})}e^{-i\pi\lambda\Delta fq^2}\}$$

which is the aberrated and defocused wavefront of the illumination emerging from illuminator 6. It can be brought back into focus by mathematical propagation. If aberrations are known, the aberration function can be deconvolved and the original front, $\Psi_{in}$, retrieved. If the illumination configuration is known (e.g. a plane wave), the direct result is an aberration function of the system.

Situation 4.2:
If a sample S is present in the sample plane S' and illumination is arbitrary, then because:

$$\Psi_{out}=\Psi_{in}O$$

Eq. (12) becomes:

$$\Psi_{bfp2}=FT\{\Psi_{im}\}=FT\{1\cdot(\Psi_{out}\otimes IFT\{K_{cs}(\vec{q})e^{-\chi(\vec{q})}e^{-\pi\lambda\Delta fq^2}\})A\} \quad (12b)$$

and the reconstructed item given by the mathematical scheme is:

$$\Psi_{out}\otimes IFT\{K_{cs}(\vec{q})e^{-i\chi(\vec{q})}e^{-i\pi\lambda\Delta fq^2}\}$$

which is the aberrated and defocused front of the output electron wave emerging from the sample S. It can be brought back into focus by mathematical propagation. If aberrations are known, the aberration function can be deconvoluted and the original exit electron wave from the sample S, $\Psi_{out}$, retrieved. If the illumination configuration is known or determined (e.g. using the configuration in Situation 4.1 above), the object function can be fully recovered.

Embodiment 3

Consider the following relationships (see above):

$$I_D^n=|\Psi_{res}^n|^2$$

$$\Psi_{res}^n=FT\{\Psi_{in}O_{res}A^n\}$$

where $I_D^n$ and $A^n$ are, respectively, an image and modulator function pertaining to an $n^{th}$ measurement session. One can recognize herein a generalized form of the situations represented by any pair of the three pairs of Eqs. (2)-(3) (Example 1), (6)-(7) (Example 2) and (13)-(14) (Example 3) obtained during a series of measurement sessions $\{m_n\}$, $n=\{1,\ldots,N\}$. $\Psi_{res}^n$ and $O_{res}$ assume specific forms in the specific examples. One can formulate different problems to be solved, as follows:

(α) Given $I_D^n$, $A^n$ and $\Psi_{in}$, find $O_{res}$.
(β) Given $I_D^n$, find $A^n\Psi_{in}$ and $O_{res}$.

Problem (α) is referred to as a non-blind reconstruction, and problem (β) is referred to as a fully-blind reconstruction. Both of these problems can be simplified by parameterizing A and creating a linearized problem to be solved. In case (a), such a simplified problem can be specified as follows:

(α') Find x such that |Px|=b,
where:
Matrix P is a Fourier transform composed with the modulation action that expresses the employed parameterization;
b is composed of the measurements $\sqrt{I_D}$;
Complex variable x describes the (possibly aberrated) exit wave at the sample plane S'.

There are numerous algorithms that can be used to find x given P and b. For example, one can use so-called "greedy algorithms". Such algorithms operate by taking a random initial guess $\hat{x}_1$ such that $|\hat{x}_1|=b$, and then projecting $\hat{x}_1$ onto the image of P. Subsequently, the amplitude of the result of this projection is corrected such that it equals b again. Iteration of this procedure progressively gets closer to the solution of the problem. Examples of such algorithms include the so-called Error Reduction Algorithm, Basic Input-Output Algorithm, Basic Output-Output Algorithm, Hybrid Input-Output Algorithm, Difference Map Algorithm, Solvent-Flipping Algorithm, Averaged Successive Reflections Algorithm, Hybrid Projection Reflection Algorithm, and Relaxed Averaged Alternating Reflectors Algorithm, for instance.

The abovementioned approach can also be used to solve the blind problem (β) by alternating between optimizing with respect to O and $A^n\Psi_{in}$. The particular scheme used to alternate between these two sub-problems can vary.

In the employed reconstruction algorithms, one can, if desired, incorporate supplementary (prior) information into the solution process, such as boundedness and non-negativity constraints, for example.

We claim as follows:

1. A method of investigating a wavefront of a charged-particle beam that is directed from a source through an illuminator so as to traverse a sample plane and land upon a detector, an output of the detector being used in combination with a mathematical reconstruction technique so as to calculate at least one of phase information and amplitude information for the wavefront at a pre-defined location along its path to the detector in which:
   said beam is caused to traverse a particle-optical lens system disposed between said sample plane and said detector;
   at a selected location in the path from said source to said detector, a modulator is used to locally produce a given modulation of the wavefront;
   in a series of measurement sessions, different such modulations are employed, and the associated detector outputs are collectively used in said mathematical reconstruction;
   wherein said selected location is disposed in an image space of said lens system.

2. A method according to claim 1, wherein said modulation is selected from the group comprising amplitude modulation, phase modulation, and combinations hereof.

3. A method according to claim 1, wherein said selected location is disposed at or proximal an image plane of said lens system.

4. A method according to claim 3 wherein the modulator comprises a phase modulator.

5. A method according to claim 1, wherein the modulator comprises:
   at least one masking plate;
   an actuator system that can be used to adjust a parameter selected from the group comprising:
      a position of said masking plate relative to an optical axis of said lens system;
      a rotational stance of said masking plate relative to said optical axis;
      a shape of said masking plate;
      a size of said masking plate,
   and combinations hereof.

6. A method according to claim 1 wherein the modulator comprises a phase modulator.

7. A method according to claim 6, wherein the modulator comprises
   at least one phase modulating element;
   an adjustment system that can be used to adjust a parameter selected from the group comprising:
      a position of said element relative to an optical axis of said lens system;
      a rotational stance of said element relative to said optical axis;
      an electrical potential or electrical current applied to said element, and combinations hereof.

8. A method according to claim 1, wherein the illuminator illuminates the sample plane with a substantially planar wavefront.

9. A method according to claim 1, wherein:
   a sample is placed in the sample plane;
   wavefront reconstruction is performed for the wavefront as it exits the sample.

10. A method according to claim 1, wherein said selected location is disposed at or proximal an image plane of said lens system.

11. A method of investigating a wavefront of a charged-particle beam that is directed from a source through an illuminator so as to traverse a sample plane and land upon a detector, an output of the detector being used in combination with a mathematical reconstruction technique so as to calculate at least one of phase information and amplitude information for the wavefront at a pre-defined location along its path to the detector, in which:
   said beam is caused to traverse a particle-optical lens system disposed between said sample plane and said detector;
   at a selected location in the path from said source to said detector, a modulator is used to locally produce a given modulation of the wavefront;
   in a series of measurement sessions, different such modulations are employed, and the associated detector outputs are collectively used in said mathematical reconstruction, wherein
   no sample is placed in the sample plane;
   wavefront reconstruction is performed for the wavefront as it enters the sample plane.

12. A method according to claim 11, wherein said modulation is selected from the group comprising amplitude modulation, phase modulation, and combinations hereof.

13. An apparatus for performing wavefront reconstruction of a charged-particle beam, comprising:
   a source of charged particles;
   an illuminator, for directing charged particles from said source onto a sample plane;
   a sample holder located at said sample plane;
   a detector, for detecting charged particles traversing the sample plane;
   a controller, for analyzing an output from said detector and using it in a mathematical reconstruction technique so as to calculate at least one of phase information and amplitude information for said wavefront at a pre-defined location along its path to the detector, the apparatus further comprising:
   a particle-optical lens system disposed between said sample plane and said detector;
   a modulator, for producing a given modulation of the wavefront at a selected location in the path from said source to said detector.

14. An apparatus as claimed in claim 13, wherein:
   said particle-optical lens system comprises a series arrangement of an objective lens and a projection lens;
   said objective lens is capable of imaging said sample plane onto an image plane;
   said modulator is disposed at or proximal said image plane.

15. An apparatus as claimed in claim 13, which apparatus is comprised in a transmission electron microscope.

16. A method according to claim 3 wherein said modulation is selected from the group comprising amplitude modulation, phase modulation, and combinations hereof.

17. A method according to claim 5 wherein said modulation is selected from the group comprising amplitude modulation, phase modulation, and combinations hereof.

18. A method according to claim 8 wherein said modulation is selected from the group comprising amplitude modulation, phase modulation, and combinations hereof.

19. A method according to any of claims 3, wherein:
   a sample is placed in the sample plane; and
   wavefront reconstruction is performed for the wavefront as it exits the sample.

* * * * *